(12) United States Patent
Roig Guitart et al.

(10) Patent No.: US 9,780,086 B2
(45) Date of Patent: Oct. 3, 2017

(54) FIELD-EFFECT TRANSISTOR WITH INTEGRATED SCHOTTKY CONTACT

(71) Applicant: SEMICONDUCTOR COMPONENTS INDUSTRIES, LLC, Phoenix, AZ (US)

(72) Inventors: Jaume Roig Guitart, Oudenaarde (BE); Samir Mouhoubi, Oudenaarde (BE); Filip Bauwens, Loppem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 16 days.

(21) Appl. No.: 14/843,852

(22) Filed: Sep. 2, 2015

(65) Prior Publication Data

US 2017/0062411 A1    Mar. 2, 2017

(51) Int. Cl.
  *H01L 29/66* (2006.01)
  *H01L 27/06* (2006.01)
  *H01L 29/06* (2006.01)
  *H01L 29/78* (2006.01)
  *H01L 29/872* (2006.01)

(52) U.S. Cl.
  CPC ...... *H01L 27/0629* (2013.01); *H01L 29/0619* (2013.01); *H01L 29/0634* (2013.01); *H01L 29/66712* (2013.01); *H01L 29/66734* (2013.01); *H01L 29/7811* (2013.01); *H01L 29/7813* (2013.01); *H01L 29/8725* (2013.01)

(58) Field of Classification Search
  CPC ............. H01L 29/7811; H01L 29/0634; H01L 29/0619; H01L 29/66712; H01L 29/8725
  See application file for complete search history.

(56) References Cited

U.S. PATENT DOCUMENTS

| 6,078,090 | A | 6/2000 | Williams et al. |
| 6,982,193 | B2* | 1/2006 | Hossain ............. H01L 29/0634 |
| | | | 257/E21.418 |
| 7,777,257 | B2 | 8/2010 | Khemka et al. |
| 7,928,470 | B2 | 4/2011 | Yamaguchi et al. |
| 7,939,850 | B2 | 5/2011 | Mauder et al. |
| 8,598,623 | B2 | 12/2013 | Yilmaz et al. |
| 9,082,845 | B1* | 7/2015 | Seok ................... H01L 29/7811 |
| 9,425,306 | B2* | 8/2016 | Gao .................... H01L 29/0634 |
| 2003/0020134 | A1 | 1/2003 | Werner et al. |
| 2005/0242411 | A1 | 11/2005 | Tso |
| 2009/0322417 | A1 | 12/2009 | Hirler et al. |
| 2011/0049564 | A1 | 3/2011 | Guan et al. |

(Continued)

OTHER PUBLICATIONS

R. K. Burra et al., "CoolMOS integral diode: a simple analytical reverse recovery model", PESC 2003, pp. 834-838.

(Continued)

*Primary Examiner* — Minh-Loan Tran
(74) *Attorney, Agent, or Firm* — Iselin Law, PLLC

(57) ABSTRACT

A semiconductor device includes a semiconductor substrate defining a major surface. The device further includes a first region including at least a first pillar of a first conductivity type extending in a vertical orientation with respect to the major surface. The device further includes a second region of the first conductivity type. The first pillar includes a higher doping concentration than the second region. The device further includes a Schottky contact coupled to the second region.

15 Claims, 7 Drawing Sheets

(56) References Cited

U.S. PATENT DOCUMENTS

| | | | |
|---|---|---|---|
| 2012/0228634 A1 | 9/2012 | Sugi et al. | |
| 2013/0207222 A1 | 8/2013 | Qu et al. | |
| 2014/0231912 A1* | 8/2014 | Willmeroth | H01L 29/7811 257/339 |
| 2014/0327104 A1* | 11/2014 | Willmeroth | H01L 29/0634 257/493 |

OTHER PUBLICATIONS

V. Khemka et al., "Bipolar Schottky Rectifier: A Novel Two Carrier Schottky Rectifier Based on Superjunction Concept", ISPSD 2009, pp. 92-95.

S. Musumeci et al., "Performance Analysis of Merged p-i-n—Schottky Diodes With Doping Compensation of the Drift Region", IEEE Transactions on Industry Applications, vol. 43 (3), 2007, pp. 636-647.

E. Napoli et al., "Design consideration of 1000V merged PiN Schottky diode using superjunction sustaining layer", ISPSD 2001, pp. 339-342.

W. Saito et al., "A Novel Low On-Resistance Schottky-Barrier Diode With p-Buried Floating Layer Structure", IEEE Transactions on Electron Devices, vol. 51 (5), 2004, pp. 797-802.

M. Schmitt et al., "A comparison of electron, proton and helium ion irradiation for the optimization of the CoolMOS body diode", ISPSD 2002, 4 pages.

P. M. Shenoy et al., "Super Junction MOSFET with Robust Body Diode", Power Semiconductors, Power Electronics Europe, Issue 3, 2007, pp. 29-31.

D. Xiaochuan et al., "Modeling and Characterization of a Merged PiN Schottky Diodes with Semi-Super Junction Structure", IEEE, 1-4244-0161, 2006, 3 pages.

C. Xu et al., "Improving the CoolMOS body-diode switching performance with integrated Schottky contacts", IEEE, 0-7803-7876, 2003, pp. 304-307.

J. Zhu et al., "High-voltage superjunction VDMOS with low reverse recovery loss", Electronics Letters, vol. 49(3), 2013, 2 pages.

\* cited by examiner

FIELD-EFFECT TRANSISTOR WITH INTEGRATED SCHOTTKY CONTACT

BACKGROUND

Metal-oxide semiconductor field-effect transistors ("MOSFETs") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. In the off state, the device may support a high voltage between the source region and the drain region.

Two major parameters affect the high-voltage MOSFET switch market: break down voltage (BVdss) and on-state resistance (Rdson). Breakdown voltage is the voltage at which the reverse-biased body-drift diode breaks down and significant current starts to flow between the source and drain while the gate and source are shorted together. The on-state resistance is the sum of various resistances, which may include (but are not limited to) one or more of: source diffusion resistance, channel resistance, accumulation resistance, drift region resistance, and substrate resistance. For a specific application, a minimum breakdown voltage is usually required, and designers meet the breakdown voltage requirement at the expense of on-state resistance. This trade-off in performance is a major design challenge for manufacturers and users of high-voltage power-switching devices.

Recently, superjunction devices have gained in popularity to improve the trade-off between breakdown voltage and on-state resistance. However, significant challenges still exist in manufacturing the superjunction devices. Specifically, providing a fast reverse recovery and a small forward voltage for a given forward current, while at the same time preventing degradation of other electrical parameters, without introducing complexity and cost remains a challenge.

SUMMARY

A semiconductor device includes a semiconductor substrate defining a major surface. The device further includes a first region including at least a first pillar of a first conductivity type extending in a vertical orientation with respect to the major surface. The device further includes a second region of the first conductivity type. The first pillar includes a higher doping concentration than the second region. The device further includes a Schottky contact coupled to the second region.

The second region may include an epitaxy of the first conductivity type. The device may further include a third region of the first conductivity type coupled to the first pillar and the second region. The first region may further include a second pillar of a second conductivity type, the first conductivity type opposite to the second conductivity type. The device may further include a fourth region of the second conductivity type, and the second pillar may include a lower doping concentration than the fourth region. The device may further include an ohmic contact coupled to the fourth region. A polysilicon-filled gate trench may be located horizontally between the first pillar and the Schottky contact. The Schottky contact may be located horizontally between two polysilicon-filled gate trenches, and the second region may divide the two polysilicon-filled gate trenches. The device may be part of a local charge balance, superjunction field effect transistor. The Schottky barrier of the Schottky contact may be 0.4 eV or less. The first region may further include a second pillar of a second conductivity type, the first conductivity type opposite to the second conductivity type. The device may further include a fourth region of the second conductivity type, the second pillar including a lower doping concentration than the fourth region. The Schottky contact may be coupled to the fourth region as well as the second region.

A method of forming a semiconductor device includes providing a semiconductor substrate defining a major surface. The method further includes forming a first region including at least a first pillar of a first conductivity type extending in a vertical orientation with respect to the major surface. The method further includes forming a second region of the first conductivity type, the first pillar including a higher doping concentration than the second region. The method further includes forming a Schottky contact coupled to the second region.

Forming the second region may include forming the second region using an epitaxy of the first conductivity type. The method may further include forming a third region of the first conductivity type coupled to the first pillar and the second region. The method may further include forming a second pillar of a second conductivity type in the first region, the first conductivity type opposite to the second conductivity type. The method may further include forming a fourth region of the second conductivity type, the second pillar including a lower doping concentration than the fourth region. The method may further include forming an ohmic contact coupled to the fourth region. The method may further include forming a polysilicon-filled gate trench. The polysilicon-filled gate trench may be located horizontally between the first pillar and the Schottky contact in the fully formed device. The method may further include forming two polysilicon-filled gate trenches. The Schottky contact may be located horizontally between the two polysilicon-filled gate trenches in the fully formed device. The second region may divide the two polysilicon-filled gate trenches in the fully formed device. The method may further include forming a local charge balance, superjunction field effect transistor including the device.

A semiconductor device includes a semiconductor substrate defining a major surface. The device further includes a first region including at least a first pillar of a first conductivity type and a second pillar of a second conductivity type extending in a vertical orientation with respect to the major surface. The first conductivity type is opposite to the second conductivity type. The device further includes a second region of the first conductivity type. The second region includes a higher doping concentration than the first pillar.

The device may further include a third region of the second conductivity, the third region including a higher doping concentration than the second pillar. The device may further include a fourth region blocking the second and the third region, the fourth region including a salicide. The device may further include a polysilicon-filled trench, wherein the fourth region interrupts the continuity of the polysilicon-filled trench. The device may be a three dimensional device. The device may be part of a local charge balance, superjunction field effect transistor.

BRIEF DESCRIPTION OF THE DRAWINGS

Accordingly, systems and methods for field-effect transistors with integrated Schottky contacts are disclosed herein. In the drawings.

Figure 1:
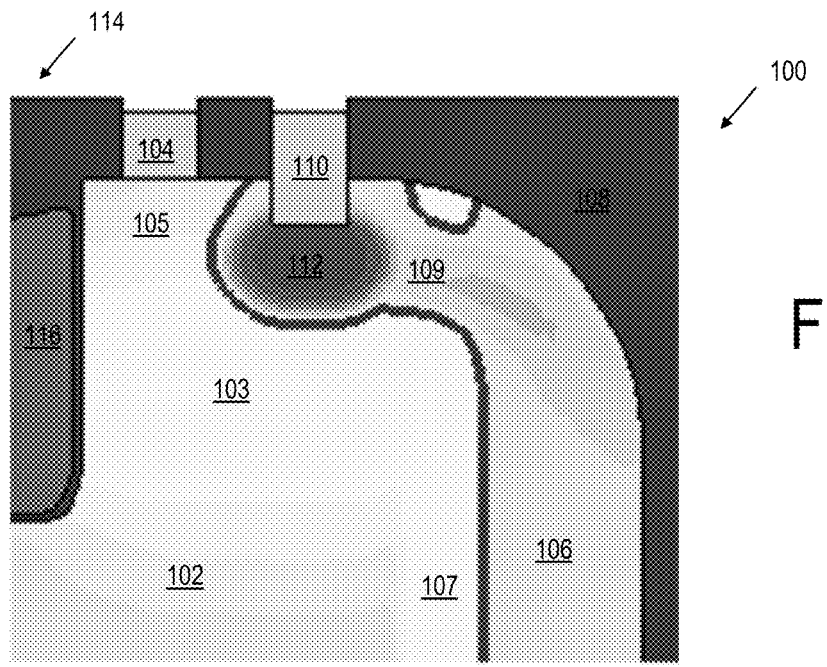
FIG. 1 is a partial view of a cross-section of an illustrative semiconductor device capable of accommodating an integrated Schottky contact.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

DETAILED DESCRIPTION

A field-effect transistor ("FET") with an integrated Schottky contact provides fast reverse recovery, a small forward voltage for a given forward current, and simultaneously prevents degradation of other electrical parameters (BVdss, sRon, Qg, Qgd, Qrr, Trr, and the like) without introducing complexity and cost to the manufacture or operation of the FET. The integrated Schottky contact also reduces body diode conduction loss in synchronous rectification as opposed to an ion irradiation process.

Figure 2:
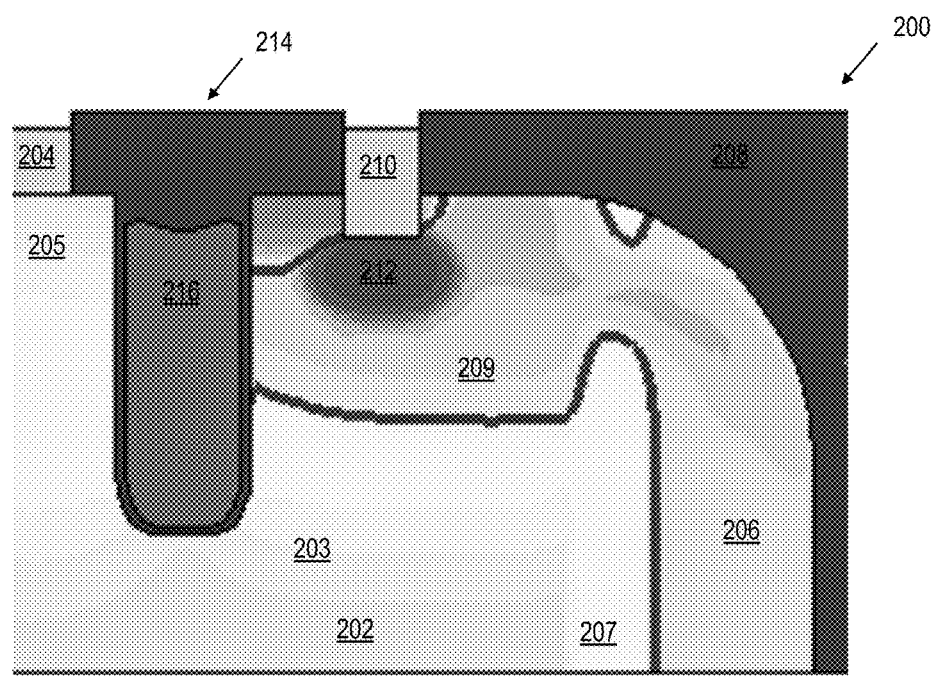
FIG. 2 is a partial view of a cross-section of an illustrative semiconductor device capable of accommodating an integrated Schottky contact.

Using Schottky structures for the UltiMOS technology (or any other local charge balance technology) also does not increase complexity or cost. Additionally, having a relatively lowly doped N-epitaxy (a doping of around $10^{14}$ cm$^{-3}$ in at least one embodiment) enables the manufacture of Schottky contacts with a very low Schottky barrier: 0.4 eV instead of 0.6-0.7 eV. A Schottky barrier is a potential energy barrier for electrons formed at a metal-semiconductor junction. Schottky barriers have rectifying characteristics, suitable for use as a diode. FIGS. 1 and 2 illustrate the integrated Schottky contacts with the surrounding structures.

FIG. 1 is a partial view of a semiconductor device 100 built on a horizontal substrate (not shown). The substrate may have a variety of configurations, such as a bulk silicon configuration or a silicon-on-insulator ("SOI") configuration that includes a bulk silicon layer, a buried insulation layer, and an active layer, wherein semiconductor devices are formed in and above the active layer. The substrate may also be made of materials other than silicon.

The designations "N" and "P" used herein refer to negative and positive conductivity types, respectively, but the opposing types may be reversed as appropriate. The device 100 includes an N epitaxial layer 102, an N link layer 103, a Schottky contact 104, a lowly-doped N layer 105, a P pillar 106, an N pillar 107, an oxide layer 108, a P body 109, an ohmic contact 110, a highly-doped P+ region 112, and a polysilicon-filled gate trench 116.

The N pillar 107 extends in a vertical orientation with respect to the substrate, and includes a higher doping concentration than the lowly-doped N layer 105, which may include an N epitaxy. In at least one embodiment, lowly-doped regions include concentrations around $10^{14}$ cm$^{-3}$ for both N and P regions. However, any combination of doping concentrations may be used as long as highly-doped regions include a higher doping concentration than lowly-doped regions.

The Schottky contact 104 is coupled to the lowly-doped N layer 105, and the Schottky barrier may be 0.4 eV or less. As such, the Schottky contact 104 is not coupled to N+ or P body wells. The high-energy N link layer 102, which may include phosphorus, is coupled to the N pillar 107 and lowly-doped N layer 105 to provide a conduction path between the Schottky contact 104 and an N+ substrate. Specifically, the conduction path includes the Schottky contact 104, the lowly-doped N layer 105, the N link layer 103, the N pillar 107, and the N substrate. Such a conduction path does not include a P region such as the P body 109, the highly-doped P+ region 112, or the P pillar 106.

Based on the charge compensation principle, the excess charge in the N pillar 107 is counter-balanced by the adjacent charges in the P pillar 106, and a uniform field distribution can thus be achieved. These pillars 106, 107 make it possible to achieve local charge balance. Accordingly, a low conduction path and low Schottky barrier may be implemented with high voltage capability, and leakages at the edges of the Schottky contact 104 are reduced.

The P pillar 106 may include a lower doping concentration than the highly-doped P+ region 112, which is coupled to the ohmic contact 110. As illustrated, the Schottky contact 104 is dedicated, but in an alternative embodiment (not shown), the Schottky contact 104 is coupled to the P+ region 112 as well as the N layer 105 simultaneously. As shown, the layer of oxide 108 separates the ohmic contact 110 and Schottky contact 104, protects the P body 109 and P pillar 106, and covers the polysilicon-filled gate trench 116. Here, the polysilicon-filled gate trench 116 is formed on one side of both contacts 104, 110. Specifically, it is formed on the left side of both contacts 104, 110, and does not horizontally separate the contact 104, 110. FIG. 2 illustrates an alternative position for the polysilicon-filled gate trench, Schottky contact, and N layer.

FIG. 2 illustrates a device 200 including an N epitaxial layer 202, an N link layer 203, a Schottky contact 204, a lowly-doped N layer 205, a P pillar 206, an N pillar 207, an oxide layer 208, a P body 209, an ohmic contact 210, a highly-doped P+ region 212, and polysilicon-filled gate trench 216. Here, the polysilicon-filled gate trench 216 is formed horizontally between the ohmic contact 210 and the Schottky contact 204, i.e. between the N pillar 207 and the Schottky contact 204. The Schottky contact 204 may be formed horizontally between two polysilicon-filled gate trenches 216, and the lowly-doped N layer 205 may divide the two polysilicon-filled gate trenches 216 as illustrated in FIG. 12B. The configurations of FIG. 1 and FIG. 2 are fully compatible with UltiMOS structures, and FIGS. 3A-12B illustrate methods of forming the devices 100, 200 in FIGS. 1 and 2.

FIGS. 3A-12B illustrate methods of forming one or more semiconductor devices. The Figures ending in "A" illustrate a method of forming the device 100 of FIG. 1, while the Figures ending in "B" illustrate a method of forming the device 200 of FIG. 2. Only portions of the devices are shown, e.g., the substrate (which may be horizontal layer of silicon below the structures depicted in the Figures) is not shown.

The semiconductor materials forming the various layers of FIGS. 3A-12B may include a variety of different materials, e.g., silicon, doped silicon, silicon/germanium, germanium, a group III-V material, etc. The layers may be formed to any desired thickness using an appropriate process, e.g., an epitaxial growth process, a deposition process, an ion implantation process, a chemical vapor deposition (CVD) process, an atomic layer deposition (ALD) process, an epitaxial deposition process (EPI), plasma versions of such processes, a wet or dry etching process, an anisotropic etching process, an isotropic etching process, an etching through hard mask process, timed etch, stop-on-contact etch, etc.

Figure 3A:
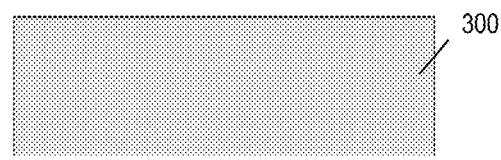
FIGS. 3A-12B are partial views of cross-sections of illustrative semiconductor devices in various stages of manufacture that illustrate methods of forming the devices with integrated Schottky contacts.
Figure 3B:
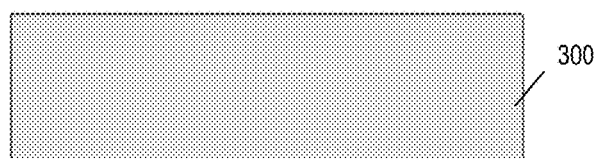

At FIGS. 3A and 3B, a layer of N epitaxy 300 is grown over the underlying structures, which may include a substrate. The layer 300 may be doped such that a bottom portion of the layer 300 is lowly-doped, a middle portion of the layer 300 is highly doped, and a top portion of the layer 300 is lowly-doped. An epitaxial layer can be doped during deposition by adding impurities to the source gas, such as arsine, phosphine or diborane. The concentration of impurity in the gas phase determines its concentration in the deposited layer. In the completed device, this layer 300 will form the N epitaxial layer, the N link layer, and lowly-doped N layer.

Figure 4A:
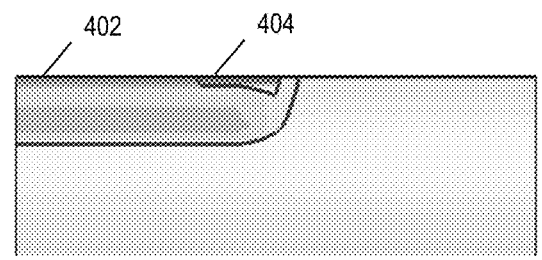
Figure 4B:
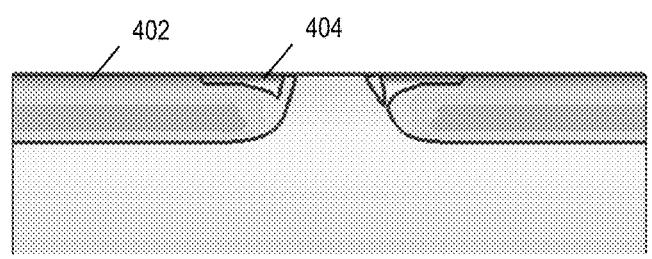

At FIGS. 4A and 4B, a layer of P material 402 is deposited into an etched portion of the N epitaxy layer, and a layer of N material 404 is deposited into an etched portion of the layer of P material 402. The various layers may be leveled using a chemical mechanical polishing ("CMP") process, and the shape of the etched portions, and hence the shape of the layers, may be manipulated using masking processes. In the completed device, the layer of P material will form the P body and highly-doped P+ region.

Figure 5A:
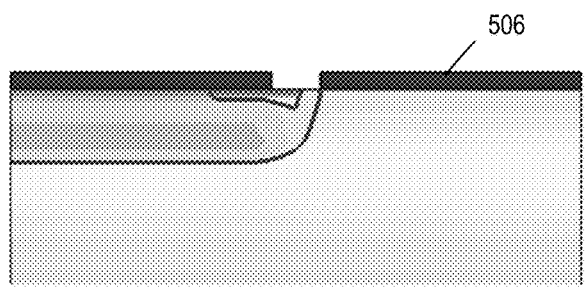
Figure 5B:
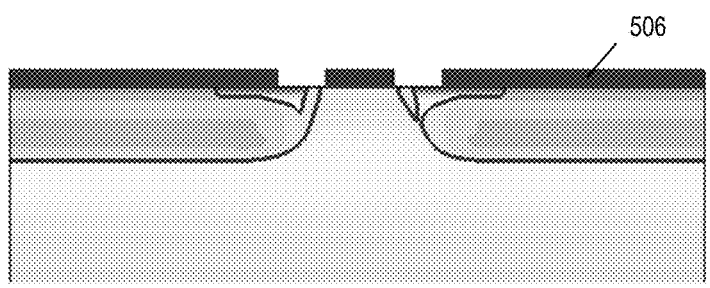

At FIGS. 5A and 5B, a masking layer 506 is deposited onto the structures in order to etch gate trenches at the positions left open by the masking layer 506. The masking material may include a photoresist which has been patterned using photolithography. Specifically, the masking layer 506 protects the structures underneath the masking layer 506 from the etchant.

Figure 6A:
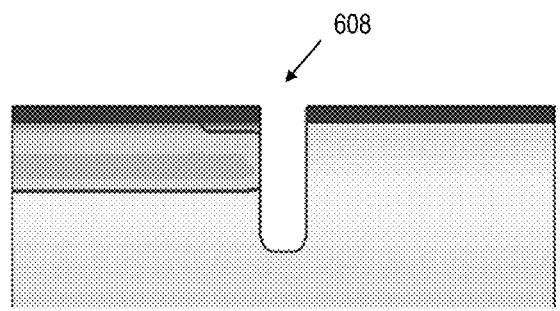
Figure 6B:
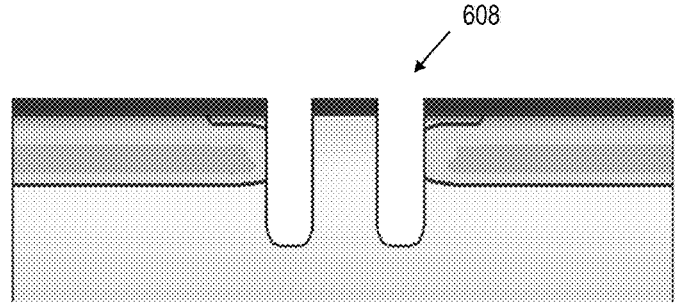

At FIGS. 6A and 6B, gate trenches 608 are etched. Specifically, an etchant is used to remove portions of the structures not protected by the masking layer. The formulas for common etchants are $HNO_3$, HF, KOH, EDP, TMAH, $NH_4F$, and $H_3PO_4$. Other etchants may be used as well. In the completed device, the gate trenches will form the polysilicon-filled gate trenches.

Figure 7A:
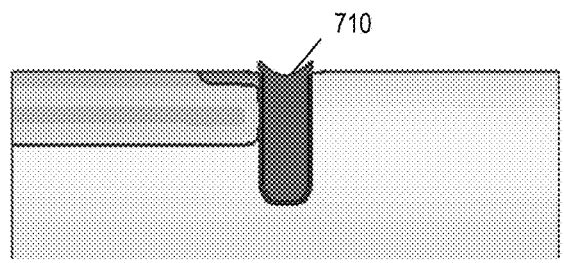
Figure 7B:
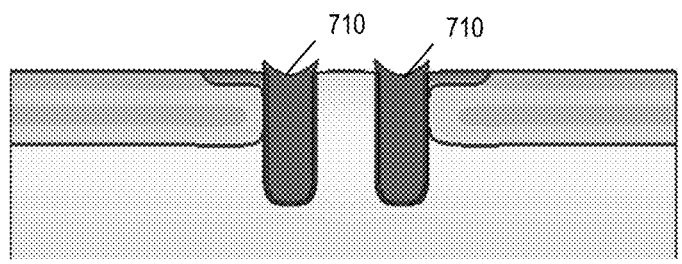

At FIGS. 7A and 7B, a polysilicon layer is deposited onto the device, thus creating a polysilicon-filled gate trench 710. The polysilicon material outside of the gate trench may be removed via CMP. In the completed device, the polysilicon layer will form the polysilicon-filled gate trenches.

Figure 8B:
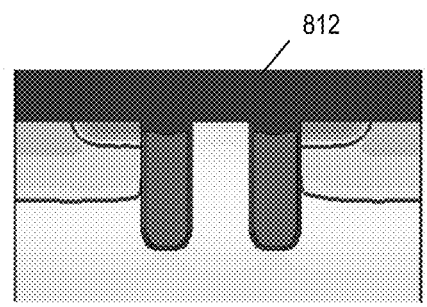
Figure 8A:
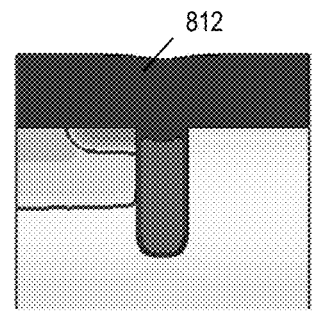

At FIGS. 8A and 8B, a hard mask layer 812 is deposited onto the device to protect the underlying structures from the superjunction trench etch. Next, the superjunction trench etch is performed, removing structures not protected by the hard mask layer 812.

Figure 9A:
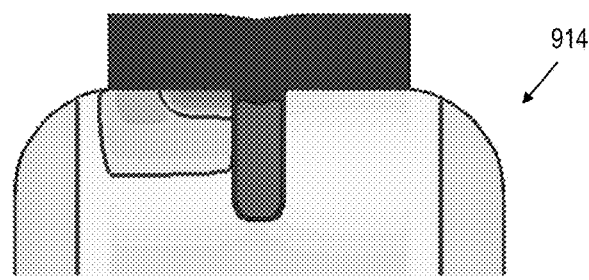
Figure 9B:
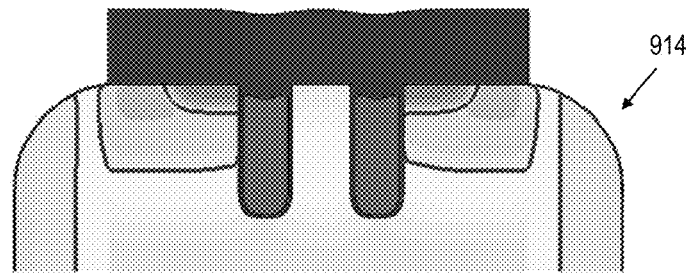

At FIGS. 9A and 9B, and sidewall structures 914 are formed via growth and etch of epitaxy materials. Specifically, an N material and P material sidewall structures 914 are grown against the sidewalls of the existing structures. The sidewall structures 914 may be doped during or after growth. In the completed device, the sidewall structures 914 form the N pillar and the P pillar.

Figure 10A:
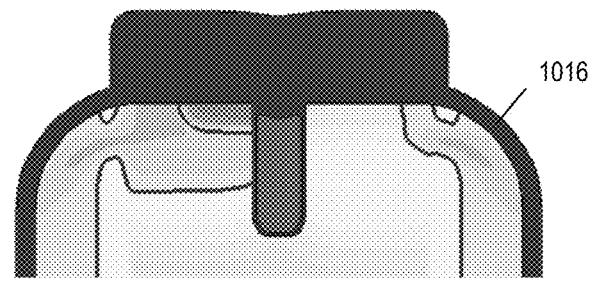
Figure 10B:
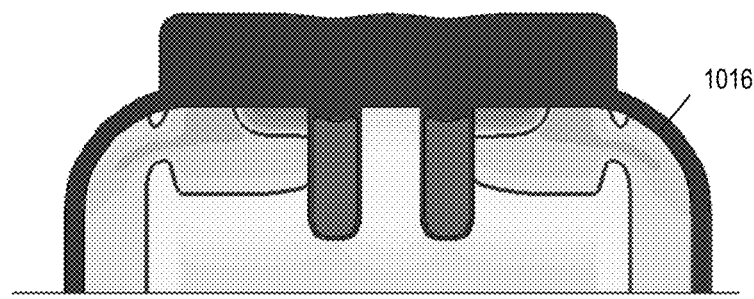

At FIGS. 10A and 10B, P material is implanted into the structures in order to connect the P body to the P pillar. Next, an oxide layer 1016 is grown as a liner to protect and cover the underlying structures.

Figure 11A:
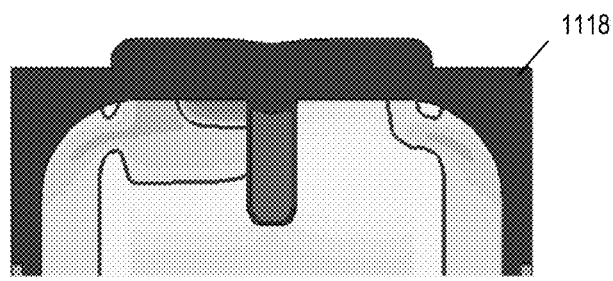
Figure 11B:
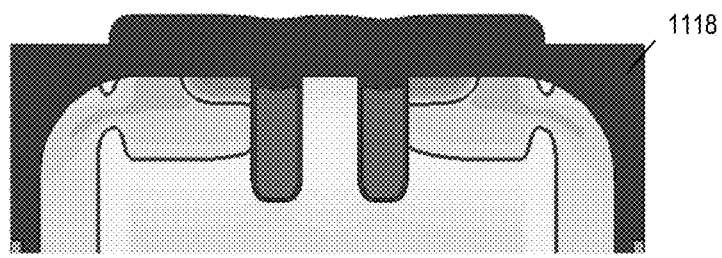

At FIGS. 11A and 11B, the trench is sealed by depositing a layer of oxide material 1118 onto the structures.

Figure 12A:
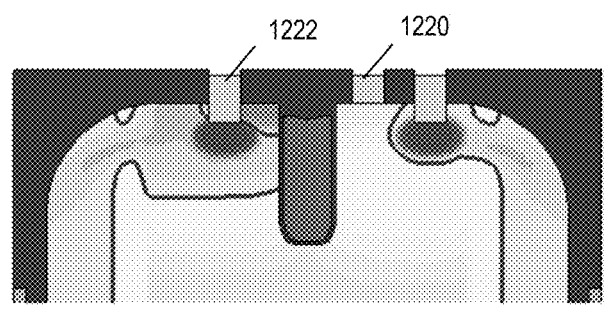
Figure 12B:
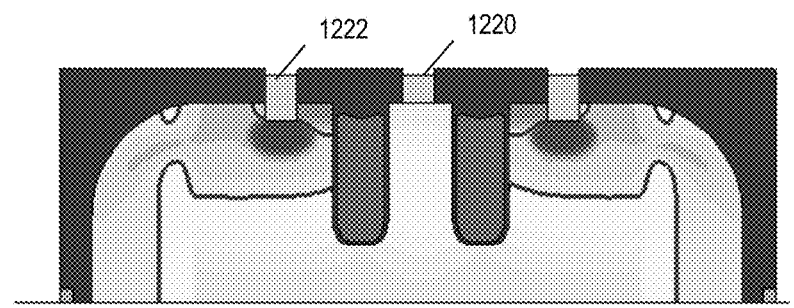

At FIGS. 12A and 12B, the layer of oxide material is etched to accommodate ohmic contacts. Next, an implant of P material is administered through the etched portions to form the highly-doped P+ region. The trench seal is also etched to accommodate the Schottky contact. Finally, contact material is used to fill the etched portions and form the ohmic 1222 and Schottky contacts 1220. The contact material may be tungsten, and a CMP process may be used to level the contacts 1222, 1220 and the device.

Figure 13:
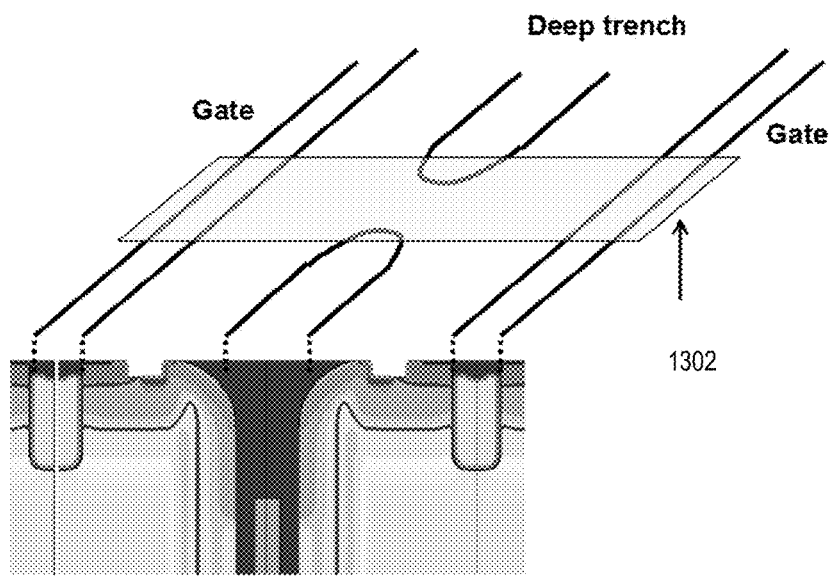
FIG. 13 is a partial isometric view of illustrative semiconductor devices capable of accommodating an integrated Schottky contact.
Figure 14:
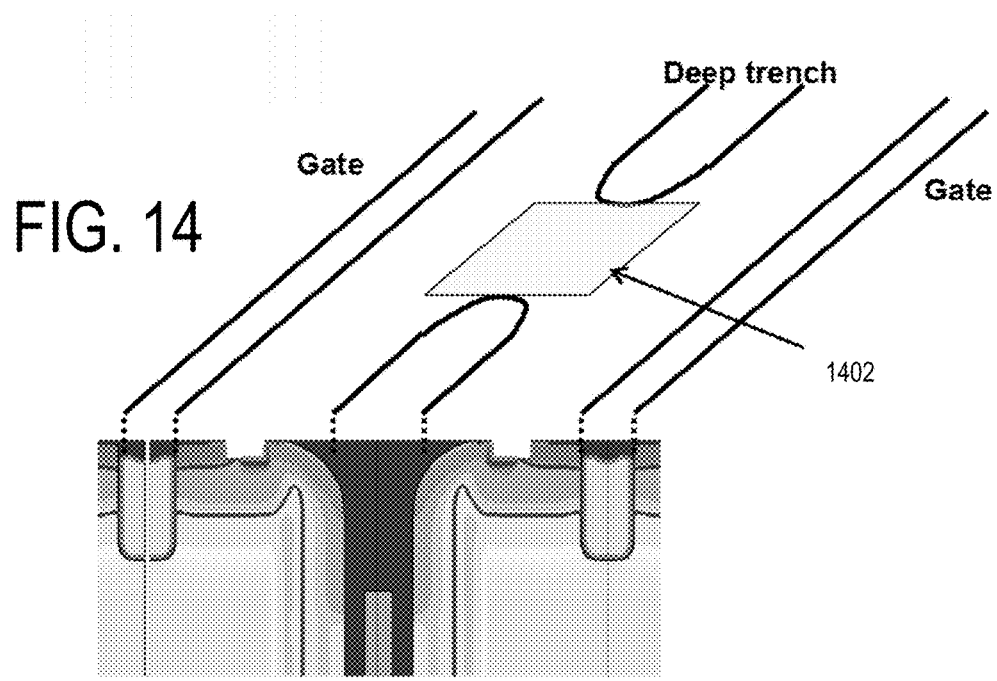
FIG. 14 is a partial isometric view of illustrative semiconductor devices capable of accommodating an integrated Schottky contact.

FIGS. 13 and 14 illustrate three dimensional local charge balance, superjunction FET devices with blocking implants 1302, 1402. The devices include many of the same structures illustrated in FIGS. 1-12B, and also include wide blocking implant 1302 and a narrow blocking implant 1402. Specifically, the deep trenches of oxide material (reference 108 in FIG. 1 and reference 1118 in FIG. 11) are blocked by the blocking implant 1302, 1402, which may include a salicided region and may optionally accommodate metal contacts. The salicide process includes the reaction of a thin metal film with silicon to form a metal silicide contact through a series of annealing and/or etch processes. In FIG. 13, the blocking implant 1302 is formed between the two deep trenches and extends to the gate regions of the device. In FIG. 14, the blocking implant 1402 is restricted to the center of the device allowing the channel region including the P body and N+ regions to be present.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A semiconductor device comprising:
   a semiconductor substrate defining a major surface;
   a first region comprising at least a first pillar of a first conductivity type extending in a vertical orientation with respect to the major surface,
   a second region of the first conductivity type, the first pillar comprising a higher doping concentration than the second region;
   a Schottky contact coupled to the second region; and
   a polysilicon-filled gate trench located horizontally between the first pillar and the Schottky contact.

2. The device of claim 1, wherein the second region comprises an epitaxy of the first conductivity type.

3. The device of claim 1, wherein the first region further comprises a second pillar of a second conductivity type, the first conductivity type opposite to the second conductivity type, and wherein the device further comprises a fourth region of the second conductivity type, the second pillar comprising a lower doping concentration than the fourth region, and an ohmic contact coupled to the fourth region.

4. The device of claim 1, wherein the Schottky contact is located horizontally between two polysilicon-filled gate trenches, the second region dividing the two polysilicon-filled gate trenches.

5. The device of claim 1, wherein the device is part of a local charge balance, superjunction field effect transistor.

6. The device of claim 1, wherein a Schottky barrier of the Shottky contact is 0.4 eV or less.

7. A method of forming a semiconductor device comprising:
   providing a semiconductor substrate defining a major surface;
   forming a first region comprising at least a first pillar of a first conductivity type extending in a vertical orientation with respect to the major surface,
   forming a second region of the first conductivity type, the first pillar comprising a higher doping concentration than the second region;
   forming a Schottky contact coupled to the second region; and
   forming a polysilicon-filled gate trench,
   wherein polysilicon-filled gate trench is located horizontally between the first pillar and the Schottky contact in the fully formed device.

8. The method of claim 7, wherein forming the second region comprises forming the second region using an epitaxy of the first conductivity type.

9. The method of claim 7, further comprising:
   forming a second pillar of a second conductivity type in the first region, the first conductivity type opposite to the second conductivity type;
   forming a fourth region of the second conductivity type, the second pillar comprising a lower doping concentration than the fourth region; and
   forming an ohmic contact coupled to the fourth region.

10. The method of claim 7, further comprising forming two polysilicon-filled gate trenches, wherein the Schottky contact is located horizontally between the two polysilicon-filled gate trenches in the fully formed device, and wherein the second region divides the two polysilicon-filled gate trenches in the fully formed device.

11. The method of claim 7, further comprising forming a local charge balance, superjunction field effect transistor comprising the device.

12. A semiconductor device comprising:
    a semiconductor substrate defining a major surface;
    a first region comprising at least a first pillar of a first conductivity type and a second pillar of a second conductivity type extending in a vertical orientation with respect to the major surface, wherein the first conductivity type is opposite to the second conductivity type;
    a second region of the first conductivity type, the first pillar comprising a higher doping concentration than the second region;
    a third region of the second conductivity, the third region comprising a higher doping concentration than the second pillar; and
    a fourth region blocking the second and the third region, the fourth region comprising a salicide.

13. The device of claim 12, further comprising a polysilicon-filled trench, wherein the fourth region interrupts the continuity of the polysilicon-filled trench.

14. The device of claim 12, wherein the device is a three dimensional device.

15. The device of claim 12, wherein the device is part of a local charge balance, superjunction field effect transistor.

* * * * *